(12) United States Patent
Fritz et al.

(10) Patent No.: US 8,431,197 B2
(45) Date of Patent: Apr. 30, 2013

(54) LAYERED REACTIVE PARTICLES WITH CONTROLLED GEOMETRIES, ENERGIES, AND REACTIVITIES, AND METHODS FOR MAKING THE SAME

(75) Inventors: Gregory M. Fritz, Pikesville, MD (US); Robert Allen Knepper, Baltimore, MD (US); Timothy P. Weihs, Baltimore, MD (US); Alexander E. Gash, Brentwood, CA (US); John S. Sze, Saratoga, CA (US)

(73) Assignees: Lawrence Livermore National Security, LLC, Livermore, CA (US); John Hopkins University, Baltimore, MD (US)

( * ) Notice: Subject to any disclaimer, the term of this patent is extended or adjusted under 35 U.S.C. 154(b) by 598 days.

(21) Appl. No.: 12/605,281

(22) Filed: Oct. 23, 2009

(65) Prior Publication Data

US 2013/0078466 A1    Mar. 28, 2013

Related U.S. Application Data

(60) Provisional application No. 61/107,915, filed on Oct. 23, 2008.

(51) Int. Cl.
*A47G 19/22*    (2006.01)

(52) U.S. Cl.
USPC .......................... 428/34.4; 428/323

(58) Field of Classification Search .................. 428/323, 428/34.4
See application file for complete search history.

(56) References Cited

U.S. PATENT DOCUMENTS

| | | | |
|---|---|---|---|
| 5,980,604 A * | 11/1999 | Lavernia | 75/338 |
| 6,863,992 B2 * | 3/2005 | Weihs et al. | 428/607 |
| 6,991,855 B2 * | 1/2006 | Weihs et al. | 428/607 |
| 2005/0142495 A1 * | 6/2005 | Van Heerden et al. | 430/311 |
| 2006/0068179 A1 * | 3/2006 | Weihs et al. | 428/209 |
| 2009/0173626 A1 * | 7/2009 | Duckham et al. | 204/298.13 |
| 2010/0033264 A1 * | 2/2010 | Foged et al. | 333/109 |

* cited by examiner

*Primary Examiner* — N. Edwards
(74) *Attorney, Agent, or Firm* — James S. Tak

(57) ABSTRACT

An energetic composite having a plurality of reactive particles each having a reactive multilayer construction formed by successively depositing reactive layers on a rod-shaped substrate having a longitudinal axis, dividing the reactive-layer-deposited rod-shaped substrate into a plurality of substantially uniform longitudinal segments, and removing the rod-shaped substrate from the longitudinal segments, so that the reactive particles have a controlled, substantially uniform, cylindrically curved or otherwise rod-contoured geometry which facilitates handling and improves its packing fraction, while the reactant multilayer construction controls the stability, reactivity and energy density of the energetic composite.

10 Claims, 4 Drawing Sheets

LAYERED REACTIVE PARTICLES WITH CONTROLLED GEOMETRIES, ENERGIES, AND REACTIVITIES, AND METHODS FOR MAKING THE SAME

CLAIM OF PRIORITY IN PROVISIONAL APPLICATION

This application claims priority in provisional application filed on Oct. 23, 2008, entitled "Layered Reactive Particles with Controlled Geometries, Energies, and Reactivities, and Methods for Making the Same" Ser. No. 61/107,915, by Alexander E. Gash et al, and incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND OF THE INVENTION

A. Technical Field

The present invention relates to energetic systems such as primers, igniters, and detonators, and more particularly to an energetic composite and a method of fabricating the energetic composite comprising reactive particles having a multilayer construction formed by the deposition of reactive layers on a rod-shaped substrate so as to have a rod-contoured geometry, e.g. cylindrically-curved, that is controlled to tailor packing fractions as well as reactivities and reaction energies of the energetic composite.

B. Description of the Related Art

There is a need in energetic applications, such as for example pyrotechnics, heaters, delays, munitions, explosives and propulsion, for reactive substances, compositions, arrangements that can react exothermically in an effective manner. In addition, increases in long-term stability, improvements in the rate and energy of reactions, and the ability to control and tune the rates and energies of reactions are most desired.

In order to increase the reactivity of particulate systems, researchers in the past have developed powders or particles with nanometer scale diameters or dimensions. While more reactive, these powered particles have been known to suffer from surface contamination, agglomeration in larger particles, non-uniform distributions of reactants and densities in multi-powder compacts, variability in particle size, and chemical instability.

A different class of energetic materials, known as reactive multilayer foils and energetic nanolaminates comprising alternating layers of materials with large negative heats of mixing, has largely overcome many of the shortcomings of reactive powders and particles by enabling tuning and control of specific reactant chemistries that enable desired levels of stored energy and specific reactant spacing within the particles that enables a desired ignition threshold. In particular, the various design choices available for layer materials, layer dimensions, overall dimensions, bi-layer periodicity, etc. enable such reactive multilayer foils and energetic nanolaminates to be particularly tuned and controlled. FIG. 6 illustrates a cross-section of a generic energetic nanolaminate sheet construction, indicated at reference character 60, which is preferably a multilayer flash metal foil material that is periodic in one dimension in composition, or in composition and structure. They are fabricated by alternating deposition of two or more metallic materials. Individual layers can be varied in thickness from one atomic layer (~2 Å) to thousands of atoms thick (>10,000 Å). The total thickness of the multilayer foil is shown as 63 in FIG. 6. And the period of the multilayer foil is the distance (i.e. thickness) of the repeating sub unit structure comprising two adjacent metallic layers, hereinafter referred to as the "bi-layer" (such as 61 in FIG. 6) that makes up the foil. It is notable that also included in each bi-layer is a pre-reaction zone (such as 62 in FIG. 6) which is the interface region between the adjacent layers of the multilayer and is made up of a thin layer of intermetallic product formed during deposition. When a localized pulse of energy such as a small spark or flame or mechanical impact is applied to one end of a multilayer foil, the layers of the foil intermix and release heat (exothermic reaction), thereby creating a self-propagating reaction that travels along the foil at velocities that can exceed 10 m/s with maximum temperatures above 1200° C. The environmentally friendly reactive foils can be used to ignite propellants or explosives in place of hazardous azides and can serve as energy sources for local heaters and blast enhancers.

In many energetic applications, however, a particle geometry is still desired instead of a foil or sheet geometry, such as due to packing considerations for example. In particular, it is often desirable to use reactive particles with specific geometries that enable low packing fractions. Previous methods, such as for example crushing or cutting reactive foils have been employed to form reactive particles. However, the resulting particles are typically not uniform in their geometry, which prevents their packing fraction and hence energy per volume from being easily controlled. And still other methods to form reactive particles have involved forming core/shell particles. However, the resulting particles typically have only two to three shells or layers and thus are very small and very hard to manipulate if the reactant spacing (shell thickness) is only tens of nanometers thick. For ease of handling it is desirable to use reactive particles with geometries that range in thickness, width, length or diameter from a few microns to several hundred microns, and reactive particles with geometries that enable packing or volume fractions ranging from 5% to almost 70%.

It would therefore be advantageous to provide reactive particles (and a method of fabrication) with controlled external geometries that facilitate handling and improve packing, in addition to having reactant layers (e.g. nanoscale layers) within the particles to control stability, reactivity and energy density similar to the tunable properties offered by reactive foils.

SUMMARY OF THE INVENTION

One aspect of the present invention includes an energetic composite comprising: a plurality of reactive particles each having a cylindrically-curved body radially spaced from a corresponding cylindrical axis, said cylindrically-curved body having a reactive multilayer construction with successive reactive layers stacked in a radially outward direction from the cylindrical axis.

Another aspect of the present invention includes a method of fabricating an energetic composite comprising: providing a rod-shaped substrate; successively depositing reactive layers on all sides of the rod-shaped substrate to form a reactive multilayer thereon having a tube-shaped configuration; dividing the reactive-layer-deposited rod-shaped substrate into a plurality of substantially uniform longitudinal segments; and removing the rod-shaped substrate from the longitudinal segments so that the reactive multilayers remain as a plurality of reactive particles.

Another aspect of the present invention includes an energetic composite comprising: a plurality of reactive particles each having a reactive multilayer construction formed by successively depositing reactive layers on a rod-shaped substrate having a longitudinal axis, dividing the reactive-layer-deposited rod-shaped substrate into a plurality of substantially uniform longitudinal segments, and removing the rod-shaped substrate from the longitudinal segments, so that the reactive particles have a substantially uniform, rod-contoured geometry.

Generally, the present invention is an energetic composite comprising a plurality of reactive particles each having a reactive multilayer construction with alternating reactant layers for controlling energies and reactivities, and formed as a cylindrically-curved body (or otherwise rod-contoured body) whose geometry may be easily tailored/controlled (as a part of a fabricating step) so as to enable easy handling and low packing fractions, and thus deliver improved performance in a variety of energetic applications. The present invention also includes methods for fabricating these layered reactive particles of the energetic composite to have specific, controlled external geometries, controlled internal geometries and properties, and a controlled reactive multilayer construction. For example, the reactive particles may be specifically fabricated to have a preferred range of maximum external dimensions between about 1 micron and about 500 microns, a preferred range of packing fractions between about 1% and about 70%, a preferred range of reactant layer spacing from about 1 nm to about 1000 nm, a preferred range of heats of reaction (500 J/g to 4300)/g), and a preferred range of reactant layer spacing from about 1 nm to about 1000 nm.

The cylindrically-curved or otherwise rod-contoured body of the reactive multilayer is formed as a result of being deposited on, and subsequently removed from, a rod-shaped substrate. The rod-contoured body/geometry of the reactive multilayer may be either tube-shaped or trough-shaped, depending on whether deposition is performed on all sides of the rod-shaped substrate, or just one side. Where the rod-shaped substrate is a cylindrical substrate, the rod-contoured body becomes a cylindrically-curved body which follows the contour of the cylinder. But in any case, the rod-contoured body is radially spaced from a central longitudinal axis (i.e. a cylindrical axis in the case of the cylindrical substrate). In one exemplary embodiment, the tube-shaped body/geometry is cylindrical, with a closed, annular cross-section, and in another exemplary embodiment, the trough-shaped body/geometry is semi- or half-cylindrical, with an open, substantially C-shaped cross-section. Furthermore, it is appreciated that the rod-shaped substrate may be solid or hollow, with a hollow rod substrate also characterized as a tube or tubular. As used herein and in the claims, the terms "tube-shaped" and "tubular" mean having a closed cross-section, such as an annular cross-section, that completely surrounds a longitudinal axis and hollow core, and "trough-shaped" means having an open cross-section, such as a C-shaped cross-section, that partially surrounds a longitudinal axis and hollow core. In addition, as used herein and in the claims, the term "geometry" includes shape, dimensions, configuration, and arrangement, and "substantially uniform geometry" means having substantially the same shape, dimensions, configuration, and arrangement, especially uniformity between the plurality of reactive particles of the energetic composite.

Dimensional conventions used herein and in the claims are as follows: the length of the reactive particles is taken along the cylindrical axis, i.e. the longitudinal axis; the width of the reactive particles is the widest part of the rod-contoured body measured orthogonal to the longitudinal axis; and the thickness of the reactive particles is defined/measured between a radially innermost surface and a radially outermost surface of the multilayer construction, and is thus a function of the deposition step. Similarly, the width of the reactive particle is also largely a function of the multilayer fabrication process. It is notable that while the reactive particles of the present invention are suitably small in the sub-millimeter range, they are not a "powder" in the classic sense of dry fine particles or granules. In particular, the reactive particles preferably have sub-millimeter dimensions, from about 1 micron to about 500 microns, and have large length and width dimensions relative to the thickness dimension produced by the deposition step of multilayer fabrication.

The external geometries or volume of the reactive particles may be controlled and specified by selecting a predetermined length, width (or outer diameter), and thickness, which in turn may be used to control the packing fraction when the reactive particles are packed into a given space. Packing fraction or ratio is defined as the ratio of the total volume of a set of objects packed into a given space to the volume of that space, and is a function of the reactive particle's external geometry. In particular, by controlling the thickness and/or the inner radial distance between the innermost surface of the reactive multilayer and the longitudinal axis, one can easily tune the fraction of the particle's total volume that is occupied by reactive material, especially while holding the length and width fixed. Hence, the total packing fraction of the energetic material can be easily varied from about 1% to about 70%. And in another preferred embodiment, the respective lengths, widths, and thicknesses between the reactive particles may be made substantially uniform. In this manner, nearly identical geometries and volumes can lead to consistent particle-particle interactions and a controlled packing fraction.

The reactive particles of the energetic composite of the present invention are fabricated in a first exemplary method by first providing a rod-shaped substrate as described above, and successively depositing reactive layers on all sides of the rod-shaped substrate to form a reactive multilayer having a tube-shaped configuration. All sides of the rod-shaped substrate may be coated by first depositing on one side followed by coating on an opposite side. Alternatively, the tube-shaped configuration may be produced by rotating the substrate during deposition to evenly coat the substrate on all sides. The deposition step may continue until a desired or predetermined thickness is produced, one that in combination with a predetermined length and predetermined width will enable the reactive particles to be packed in a given space with a desired packing fraction from about 1% to about 70%.

The reactive multilayer construction of the reactive particles are comprised of preferably two materials (or more) of a type reactive with each other, in alternating layered arrangement to form a set of repeating bi-layers. And various depositions methods and strategies known in the art may be employed to fabricate the reactive multilayer construction of the reactive particles. For example, any of the energetic nanolaminate fabrication methods disclosed in the Barbee references (U.S. Pat. Nos. 5,538,795 and 5,547,715, U.S. Pat. Publication No. 2004/0060625) may be employed, and are incorporated by reference herein. In particular, the Barbee references teach the fabrication of energetic nanolaminates with tailored and precise reaction wave front velocities, energy release rates, and ignition temperatures. In any case, it is appreciated that the stored energy and reaction velocities of the energetic multilayers and nanolaminates can be systematically and independently controlled by materials selection, size scale of the layers, etc. For example, a monolithic energetic multilayer having reduced thicknesses of individual layers may be used to increase the reaction speed and sensitivity of the material. This is because with decreasing bi-layer thickness the average diffusion distance between reactant species in adjacent layers decreases. The bi-layer thicknesses of the foils can be readily and precisely controlled via magnetron sputtering. The bi-layer thickness of the multilayer structure of the monolithic multilayer and the energetic pieces is preferably from about 10 nm to about 200 nm.

The preferred material composition of the reactive multilayer construction is preferably selected from, but not limited to, the following materials and their reaction products: aluminum, nickel, iron, aluminum oxide, titanium, zirconium, and iron oxide. In particular, the two materials of the bi-layers of the energetic multilayers are preferably selected from the group consisting of Zr/Al, Ni/Al, Al/Monel™ 400, Ni/Si, Mo/Si, Pd/Al, Rh/Al, Ti/B, Ti/C, Zr/B, Ti/B$_4$C, and Zr/B$_4$C. It is appreciated that these materials have much more desirable environmental and health characteristics than NOL-130 composition which is a commonly used ignition mix. The multilayers of the nanolaminate construction may be formed using zirconium and aluminum (Zr/Al), or nickel and aluminum (Ni/Al). Ideally, toxic and hazardous components (i.e. lead-based materials) are not utilized in the multilayer structure of the present invention, choosing instead a benign material. It is appreciated that Nickel has health and environmental concerns of its own and its inclusion in new materials may become problematic. Therefore, although Ni or Ni-based alloy (Monel (Cu0.3Ni0.7)) may be utilized in the present invention for the energetic nanolaminates, a more benign material such as Zr/Al would be a better alternative for health and environmental safety. The enthalpy of reaction of the alloying of zirconium and aluminum is 1.18 J/g and the adiabatic temperature is 1650° C. Although this Zr/Al system is less energetic than the Ni/Al system with an energy density of 1.38 J/g but has a slightly higher adiabatic reaction temperature than the Ni/Al system (1640° C.).

Thermodynamic data for selected formation reactions, which may be employed in the reactive multilayer structure of the present invention, is shown in Table 1, and compiled from: I. Barin, O. Knacke, and O. Kubaschewski, eds., *Thermochemical Properties of Inorganic Substances, Supplement*, Springer-Verlag, New York, 1977; 0. Knacke, O. Kubaschewski, and K. Hesselmann, eds., 2nd edition, *Thermochemical Properties of Inorganic Substances*, Springer-Verlag, New York, 1991; F. R. de Boer, R. Boom, W. C. M. Mattens, A. R. Miedema, and A. K. Niessen, *Cohesion in Metals*, North-Holland, N.Y. (1988), all of which are incorporated by reference herein.

TABLE 1

| Reaction | Heat of Reaction (kJ/mol Atoms) | Adiabatic Reaction Temperature (° C.) | Phase of Reaction Product |
|---|---|---|---|
| Ti + 2B -> TiB$_2$ | −108 | 2920 | solid & liquid |
| Zr + 2B -> ZrB$_2$ | −108 | 3000 | solid & liquid |
| Hf + 2B -> HfB$_2$ | −110 | 3370 | solid & liquid |
| V + 2B -> VB$_2$ | −68 | 2297 | Solid |
| Nb + 2B -> NbB$_2$ | −72 | 2282 | Solid |
| Ta + 2B -> TaB$_2$ | −63 | 2400 | Solid |
| Ti + C -> TiC | −93 | 3067 | solid & liquid |
| Zr + C -> ZrC | −104 | 3417 | solid & liquid |
| Hf + C -> HfC | −105 | 3830 | solid & liquid |
| V + C -> VC | −50 | 1957 | Solid |
| Nb + C -> NbC | −69 | 2698 | Solid |
| Ta + C -> TaC | −72 | 2831 | Solid |
| 5Ti + 3Si -> Ti$_5$Si$_3$ | −72 | 2120 | solid & liquid |
| 5Zr + 3Zi -> Zr$_5$Si$_3$ | −72 | 2250 | solid & liquid |
| 5Hf + 3Si -> Hf$_5$Si$_3$ | −70 | 2200 | solid & liquid |
| 5V + 3Si -> V$_5$Si$_3$ | −58 | 1519 | Solid |
| 5Nb + 3Si -> Nb$_5$Si$_3$ | −57 | 2060 | Solid |
| 5Ta + 3Si -> Ta$_5$Si$_3$ | −42 | 1547 | Solid |
| 2Ni + Si -> Ni$_2$Si | −48 | 1306 | solid & liquid |
| Ti + Al -> TiAl | −36 | 1227 | Solid |
| Zr + Al -> ZrAl | −45 | 1480 | solid & liquid |
| Hf + Al -> HfAl | −46 | | |
| Ni + Al -> NiAl | −59 | 1639 | solid & liquid |
| Pd + Al -> PdAl | −92 | 2380 | Liquid |
| Pt + Al -> PtAl | −100 | 2800 | Liquid |

After the deposition step, the reactive-layer-deposited rod-shaped substrate or substrates are divided into a plurality of substantially uniform longitudinal segments, such as by cutting, shearing, scoring, or other methods for dividing known in the art (e.g. laser). Next the rod-shaped substrate is removed from the longitudinal segments so that the reactive multilayers remain as a plurality of reactive particles. The removal of the substrate may be performed in various ways known in the art, including by dissolution using an etchant channeled into the hollow tube.

And in a second exemplary method of fabrication, a mesh substrate is used instead of rod-shaped substrates. Reactive layers are then successively deposited (as described above) on one side only of the mesh substrate to form a reactive multilayer having a trough-shaped configuration. The deposition step may continue until a desired or predetermined thickness is produced, one that in combination with a predetermined length and predetermined width will enable the reactive particles to be packed in a given space with a desired packing fraction from about 1% to about 70%. After deposition the reactive semi-rings of the multilayer construction are then removed from the mesh, such as by inserting into liquid, or by rubbing the reactive particles off of the mesh, or a combination of these methods.

BRIEF DESCRIPTION OF THE DRAWINGS

The accompanying drawings, which are incorporated into and form a part of the disclosure, are as follows.

DETAILED DESCRIPTION

Figure 1:
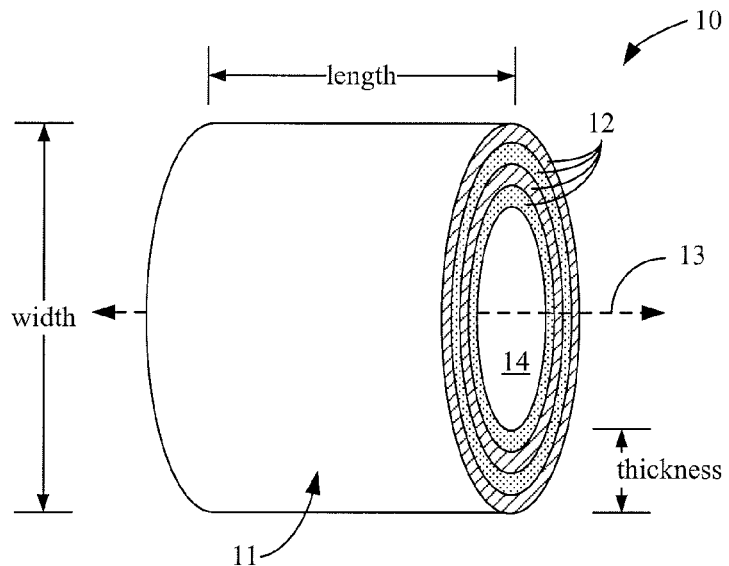
FIG. 1 is an enlarged perspective view of a single reactive particle that is representative of many such particles which comprise a first exemplary embodiment of the energetic composite of the present invention, and having a tube-shaped body configuration.

Turning now to the drawings, FIG. 1 shows a first exemplary embodiment of a single reactive particle, generally indicated at reference character 10, which represents one of a plurality of such particles which comprise the energetic composite of the present invention. As can be seen in FIG. 1, the reactive particle has a generally tube-shaped body 11 surrounding a hollow core 14, and radially spaced from a central cylindrical axis 13. The length of the particle is shown taken along the cylindrical axis 13, and the width of the particle is shown taken orthogonal to the cylindrical axis. The tube-shaped body 11 has a multilayer construction with multiple reactive layers 12 stacked in a radially outward direction from the axis. The thickness of the reactive particle is shown as the total thickness of all the multiple reactive layers combined.

Figure 2:
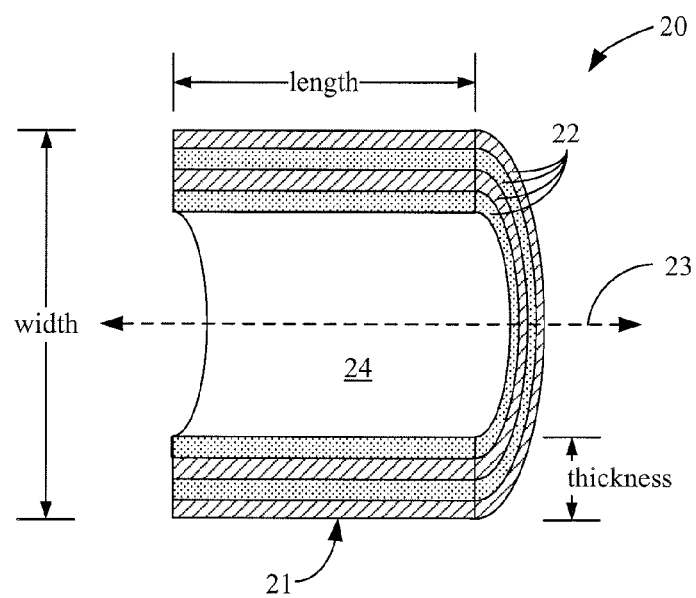
FIG. 2 is an enlarged perspective view of a single reactive particle that is representative of many such particles which comprise a second exemplary embodiment of the energetic composite of the present invention, and having a trough-shaped body configuration.

And FIG. 2 shows a second exemplary embodiment of a single reactive particle, generally indicated at reference character 20, which represents one of a plurality of such particles which comprise the energetic composite of the present invention. As can be seen in FIG. 2, the reactive particle has a generally trough-shaped body 21 partially surrounding a hollow core 24, and radially spaced from a central longitudinal axis 23. The length of the particle is shown taken along the longitudinal axis 23, and the width of the particle is shown taken orthogonal to the longitudinal axis. The trough-shaped body 21 also has a multilayer construction with multiple reactive layers 22 stacked in a radially outward direction from the axis. The thickness of the reactive particle is shown as the total thickness of all the multiple reactive layers combined. In contrast to the full cylindrical configuration of FIG. 1, FIG. 2 shows a semi- or half-cylindrical configuration with an open cross-section having a substantially C-shape. While not shown in the drawings, it is appreciated that the trough-shaped body may also include less-than-half cylindrical configurations, i.e. perimeter is less than $\pi r$. In this case, the width of such a configuration would be less than the diameter of a full cylinder having the same radial spacing from the cylindrical axis.

Figure 3:
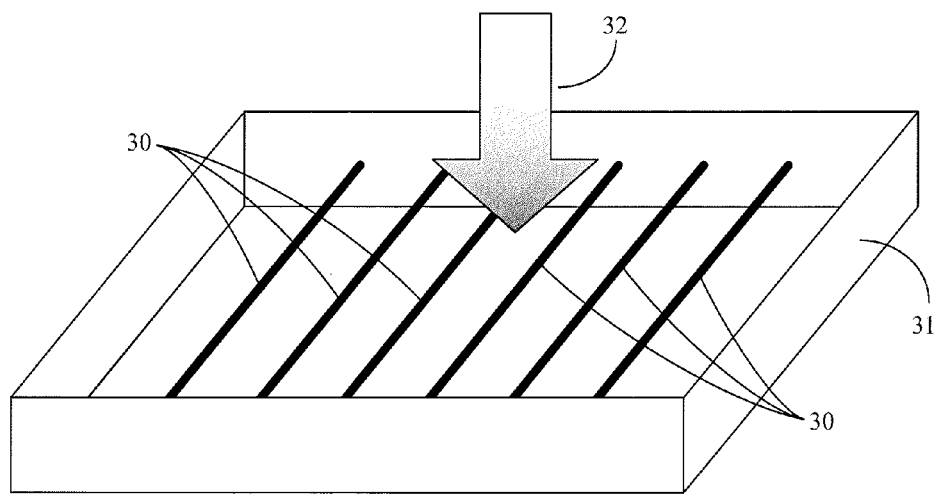
FIG. 3 is a schematic diagram of a frame holding hollow tube substrates in a deposition step in a fabrication method of the present invention.
Figure 4:
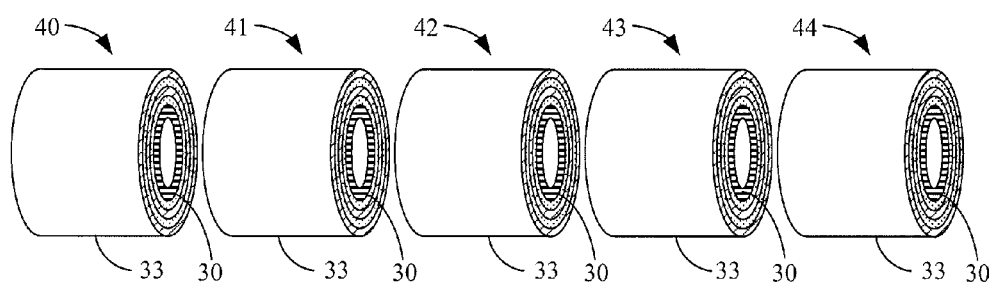
FIG. 4 is an enlarged exploded view of a reactive-layer-deposited hollow tube substrate that has been divided into a plurality of substantially uniform elongated segments.
Figure 5:
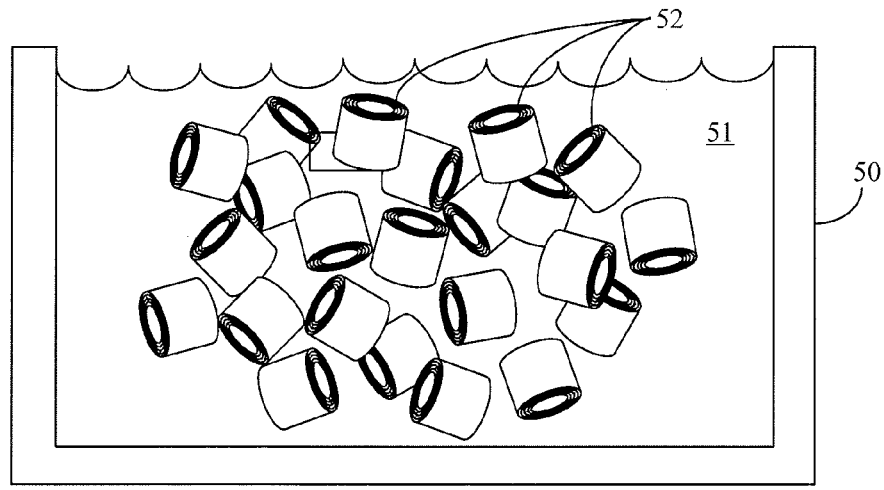
FIG. 5 is a schematic diagram of an etch bath in which the elongated segments are placed to dissolve the hollow tube substrates, so that only the multilayer constructions remain as individual reactive particles.
Figure 6:
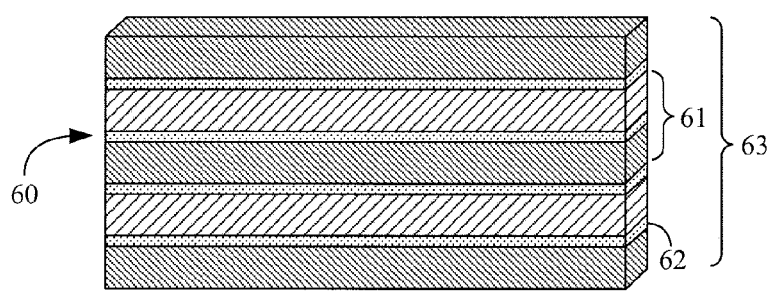
FIG. 6 is a schematic view of an energetic nanolaminate known in the art, and illustrating a conventional reactive multilayer construction.

FIGS. 3-5 illustrate an exemplary method of fabricating free-standing layered reactive particles of the present invention, which includes: depositing reactive coatings onto rod-shaped substrates, dividing the multilayer-deposited substrate into substantially uniform elongated segments, and removing the rod-shaped substrate from the elongated segments so that only the multilayer construction remains as the reactive particles. This processing technique has the advantage of being able to control the geometry of the particles (and thus, packing fraction) by varying the rod-shaped substrate diameter, the wall thickness (combined thickness of all deposited reactive materials), or the length of the cylinder (from the cutting process).

In particular, FIG. 3 is a schematic diagram of a frame 31 holding a rod-shaped substrate such as the six thin hollow tube substrates 30 in a deposition step of a fabrication method of the present invention. Deposition of various reactive materials (e.g. aluminum/nickel) on the substrates is schematically shown by arrow 32, which also indicates the direction of the deposition. And the tube substrates can have an outer diameter of a few, e.g. 50 to 500 microns and an inner diameter of a few, e.g. 10 to 400 microns. As shown in FIG. 3, the tube substrates are set horizontally in a frame in which the tube-to-tube distance can be adjusted. The multilayer material is deposited to the desired thickness on one side of the hollow tubes, at which time deposition is stopped. If deposition is completed at this point, a trough-shaped body structure is formed having an open cross section. However, if deposition is continued on the other side of the tube substrates (e.g. by flipping the frame over) the other side of the tubes may be coated to produce the tube-shaped bodies discussed above with closed cross-sections. An alternative deposition technique for producing the tube-shaped bodies would be to rotate the tubes during deposition, so that all sides are coated uniformly. Either method provides a roughly uniform thickness of reactive material around the hollow tube.

It is appreciated that multilayer structured materials can be formed by various different techniques known in the art. Physical vapor deposition, chemical vapor deposition, electrochemical deposition, electrolytic deposition, atomic layer epitaxy, mechanical deformation processing, etc. are all utilized to prepare multilayer materials. One type of physical vapor deposition involves sputtering. In sputter deposition systems atoms, or clusters of atoms, are generated in the vapor phase by bombardment of a solid source material with energetic particles. The substrate is moved past the source(s) and vapor condenses on the substrate to form a film. A single layer of material is deposited on the substrate with each pass. The thickness of component layers, and thus its resulting physical properties, is precisely controlled by adjusting the periodicity of substrate movement. And magnetron sputtering is one exemplary type of sputtering technique that is the physical vapor method of choice for the semiconductor industry. Using magnetron sputtering techniques, alternating layers of different elements, each several nanometers thick, can be deposited on top of one another to make nanometer metallic multilayers with a thin intermixed region between the layers.

The following illustrates an exemplary deposition technique to produce an Al/Ni reactive multilayer construction of the present invention. Multilayer Al/Ni foils can be deposited by DC magnetron sputtering from Al (either 1100[99 wt. % Al, 0.87 wt. % (Si, Fe), 0.12 wt. % Cu] or 7075 [90 wt. % Al, 5.6 wt. % Zn, 2.5 wt. % Mg, 1.6 wt. % Cu] alloys) and Ni (93 wt. % Ni, 7 wt. % V) targets onto rod-shaped substrates. The relative thickness of Al and Ni layers can be maintained at a 3:2 ratio in order to obtain foils with an average stoichiometry of AlNi. The coatings are deposited in either 1 mTorr of Argon (99.999% pure) in a vacuum chamber with a base pressure less than $3 \times 10^{-6}$ Torr. The resulting coating has a maximum bi-layer spacing of 50 nm and a total thickness of 10-20 um.

After deposition, the tubes are removed from the frame and divided to the desired length, such as by cutting, shearing, scoring, or other means known in the art (e.g. laser). FIG. 4 is an enlarged exploded view of a reactive-layer-deposited hollow tube substrate that has been divided into a plurality of substantially uniform longitudinal segments 40-44, with each segment having a portion of the hollow tube substrate 30, and coated with the reactive multilayer construction 33.

Following the dividing step, the tube substrate is removed, such as by dissolution, mechanical removal, or other technique. For example, FIG. 5 is a schematic diagram of an etch bath in which the elongated segments are placed to dissolve the hollow tube substrates, so that only the multilayer constructions remain as individual reactive particles. The substrate tubes are may be composed of a material (such as PMMA) that can be etched away by soaking the tubes in an appropriate etchant known in the art. Following the etching or other removal step, only the reactive multilayers remain as hollow tubular bodies, which thus form the reactive particles.

Figure 7:
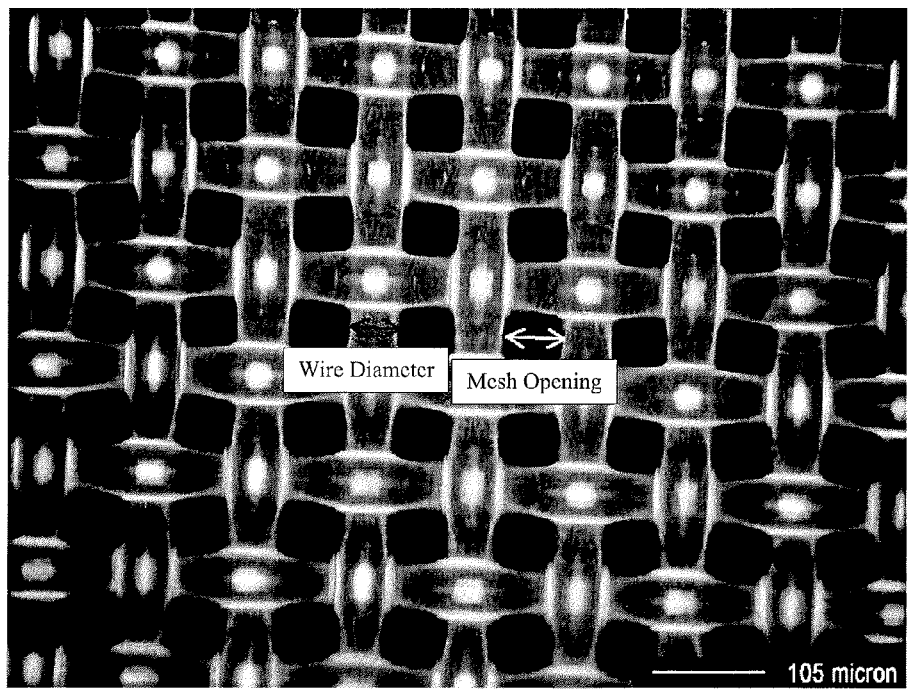
FIG. 7 is a photograph of an exemplary mesh substrate used in the deposition step of another exemplary fabrication method of the present invention.
Figure 8:
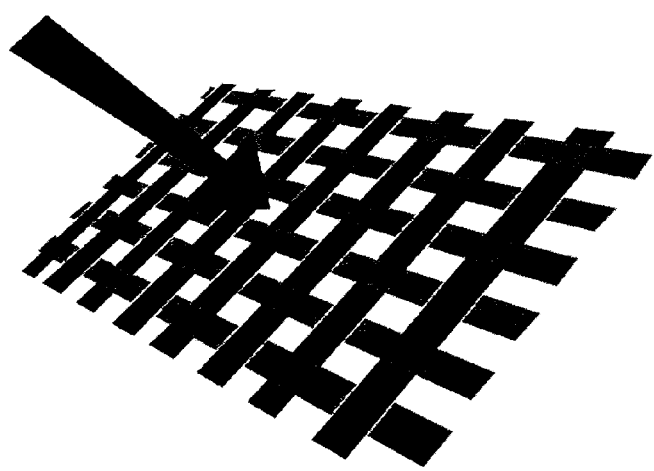
FIG. 8 is a schematic view of the one-sided deposition on the mesh substrate of FIG. 7.

FIGS. 7 and 8 illustrate an exemplary mesh substrate used in a second exemplary method of fabricating free-standing layered reactive particles of the present invention, which includes: successively depositing reactive coatings (as described above) on only one side of the mesh or weave substrate, followed by removing the reactive multilayer from the mesh substrate, so that they have a trough-shaped geometry/configuration. In particular, reactive material may be deposited for example by sputter deposition, in a direction indicated by the arrow shown in FIG. 8. And the reactive semi-rings are then removed from the mesh, such as by inserting into liquid, or by rubbing the reactive particles off of the mesh, or a combination of these methods. Various meshes and weaves can be used as substrates to vary the packing fractions and geometries of the reactive particles. Table 2 lists the mesh substrates and their characteristics.

TABLE 2

| Material | Wire Dia. (um) | Opening (um) | 2 * Opening + Wire Diameter (um) | Particle Length (est.) (um) |
|---|---|---|---|---|
| Aluminum | 53.34 | 73.66 | 200.66 | 350 |
| Bronze | 53.34 | 73.66 | 200.66 | 200 |
| Nickel | 53.34 | 73.66 | 200.66 | 300 |
| Stainless Steel | 53.34 | 73.66 | 200.66 | 210 |
| Stainless Steel | 190.5 | 228.6 | 647.7 | N/A |
| Brass | 203.2 | 64.262 | 331.724 | N/A |
| Polyester | 53.34 | 73.66 | 200.66 | 210 |
| Nylon | 55 | 50 | 155 | 180 |
| Nylon | 76.2 | 99.06 | 274.32 | 260 |

The particle length is approximately equal to two times the mesh opening plus the wire diameter and is listed in the third row of Table 2. This configuration can also be seen in FIG. 7. Particle lengths were determined by measuring around a dozen particles' end-to-end lengths with an optical microscope and have an uncertainty of 5%. The calculated particle length is a good estimate of the resulting particle length. Also, as predicted, the width of each particle is approximately equal to the diameter of the thread plus the thickness of the foil on each side. The resulting half-cylinder reactive particles are similar to those shown in FIG. 2.

To generate the particles from the coated meshes they were cut to approximately 2"×4" and inserted into a bath of distilled water in order to prevent the particles from getting airborne. By manually bending and scraping the mesh under water, particles detached from the mesh and were collected at the bottom of the container. For the plastic substrates, only folding and scrunching the mesh was required, while the metal meshes needed to be folded and the sides had to be rubbed together to remove the foil particles. After the foil was removed from the substrate, the mesh was then taken out of the water bath and the particles were allowed to settle to the bottom so that they clumped together. Then the water containing the particles was run through an ASTM filter with 50 um holes in order to collect the foil and allow it to dry. After the particles were dry, the filter was turned over onto a paper funnel and the particles were funneled into a metal container for storage. The particles were then filtered to obtain particles with a maximum length of 200 um and a uniform geometry. The mesh size determines the resulting particle size and eliminates the need for having to cut the particles to size.

The following discussion illustrates experimental packing fractions obtained using the reactive particles fabricated using a mesh substrate. In particular, half cylinder reactive particles were fabricated via sputter deposition on nylon mesh and removed under water to have uniform geometries as follows: approximately 150 microns in length, 70 microns in diameter and 20 microns in thickness. Packing fractions of these types of half cylinders were measured using small plastic vials and resulting values are listed in Table 2 for different substrate materials. In order to pack the particles evenly, the vial was dipped into a sonicator. The volume filled by the particles was measured by filling similar vials with known quantities of water until the meniscus of the water matched the height of the particles.

TABLE 3

| Mesh Substrate | Empty Vial Mass (g) | Full Vial Mass (g) | Mass of Foil (g) | Total Volume (uL) | Packing Fraction |
|---|---|---|---|---|---|
| Brass | 0.1616 | 0.2777 | 0.1161 | 160-170 | .132-.141 |
| Nylon | 0.1615 | 0.4407 | 0.2792 | 190-200 | .271-.285 |
| Nylon #2 | 0.1644 | 0.4877fs | 0.3233 | 200-210 | .298-.313 |
| Polyester | 0.1622 | 0.4122 | 0.25 | 150-160 | .303-.323 |
| Polyester #2 | 0.1624 | 0.4137 | 0.2513 | 160-170 | .286-.304 |

The reaction of these particles was also characterized by measuring the velocity of self-propagating reactions that were ignited at room temperature in air and in vacuum. The measurements were made by filming reactions at 240 frames per second through the window on a vacuum chamber using a Sony HD Camcorder. The foil particles were funneled into glass tubes 0.25" in diameter and about 1.25" in length with EPDM plugs inserted into each end. In one plug a nickel-chromium wire with a 0.01" diameter was looped through, creating a small filament inside the tube that could be heated for ignition, and in the other plug, multiple pieces of SS tubing with a 50 um ID were inserted so that air could flow from the tube into the chamber. In the case of the vacuum experiments the pressure was 80 mTorr and for the case of air, the pressure was approximately 760 Ton. An electrical pulse of 30 Volts and 3 Amps was generated by a DC power supply and sent through the feed to heat the filament and in turn ignite the foil. By measuring the length of the tube occupied by foil and the timing on the frames shot by the camera the velocity was determined. The velocity of Ni/Al particles with a 50 nm bi-layer spacing, which were removed from the Nylon #2 substrate and reacted in vacuum, had an average reaction velocity of 0.02 m/s.

Since these particles consist of hundreds or thousands of layers with nanoscale thickness, the rate at which the reactants mix and produce heat can be controlled. Basically, the thinner the layers the faster the mixing and the faster that heat is released. By decreasing the bi-layer thickness from 50 nm to 40 nm, the reaction velocity can be increased. In a similar manner, the long term stability of the particle's energy can be controlled by varying layer thickness: the thicker the layers, the greater the stability.

The total energy delivered by a particle reacting is determined by the chemistries of the reactants as well as the ratio of their layer thicknesses. The reactive particle's layers can alternate between two elements (i.e. bi-layers) that mix to form a compound, such as Al and Ni or Ti and C, or they can alternate between a reducing agent and an oxide such as Al and $CuO_x$, Al and $Fe_2O_3$ or Zr and $MoO_3$. Heats released when these various reactants mix can range from 500 J/g to over 4000 J/g. For the Ni/Al based reactive particles described above, Differential Scanning calorimetry was used to measure a heat of 1100 J/g for the particles. By changing the chemistry of this system, this value can be raised or lowered.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

We claim:

1. An energetic composite comprising:
a plurality of reactive particles each having a cylindrically-curved body radially spaced from a corresponding cylindrical axis, said cylindrically-curved body having a reactive multilayer construction with successive reactive layers stacked in a radially outward direction from the cylindrical axis.

2. The energetic composite of claim 1,
wherein the cylindrically-curved bodies have a shape selected from the group consisting of tube-shaped and trough-shaped.

3. The energetic composite of claim 1,
wherein the cylindrically-curved bodies are of substantially uniform geometry.

4. The energetic composite of claim 3,
wherein each of a length and a width of the cylindrically-curved bodies characterizing an external geometry of the cylindrically-curved bodies is greater than about 1 micron and less than about 500 microns.

5. The energetic composite of claim 4,
wherein the reactive multilayer constructions of the cylindrically-curved bodies have a thickness selected in combination with the length and width of the external geometry so that the reactive particles packed into a space have a packing fraction from about 1% to about 70%.

6. An energetic composite comprising:
a plurality of reactive particles each having a reactive multilayer construction formed by successively depositing reactive layers on a rod-shaped substrate having a longitudinal axis, dividing the reactive-layer-deposited rod-shaped substrate into a plurality of substantially uniform longitudinal segments, and removing the rod-shaped substrate from the longitudinal segments, so that the reactive particles have a substantially uniform, rod-contoured geometry.

7. The energetic composite of claim 6,
wherein the substantially uniform, rod-contoured geometry of the reactive particles has a trough-shaped configuration.

8. The energetic composite of claim 6,
wherein the substantially uniform, rod-contoured geometry of the reactive particles has a tube-shaped configuration.

9. The energetic composite of claim 6,
wherein each of a length and a width of the reactive particles characterizing an external geometry of the reactive particles is greater than about 1 micron and less than about 500 microns.

10. The energetic composite of claim 9, wherein the reactive multilayer constructions of the reactive particles have a thickness selected in combination with the length and width of the external geometry so that the reactive particles packed into a space have a packing fraction from about 1% to about 70%.

* * * * *